United States Patent [19]
Devin et al.

[11] Patent Number: 5,959,886
[45] Date of Patent: Sep. 28, 1999

[54] PAGE-WRITE INDICATOR FOR NON-VOLATILE MEMORY

[75] Inventors: Jean Devin, Le Tholonet, France; Alessandro Brigati, Castelsangiovanni, Italy; Bruno Leconte, Rousset, France

[73] Assignee: SGS-Thomson Microelectronics S.A., Saint Genis, France

[21] Appl. No.: 09/009,088

[22] Filed: Jan. 20, 1998

[30]     Foreign Application Priority Data

Jan. 21, 1997  [FR]  France ................................. 97 00710

[51] Int. Cl.⁶ .................................................. G11C 16/04
[52] U.S. Cl. ................. 365/185.12; 365/236; 365/238.5
[58] Field of Search .............................. 365/185.12, 236, 365/238.5

[56]              References Cited

U.S. PATENT DOCUMENTS 5,742,543   4/1998   Fazio ................................... 365/185.21
5,754,469   5/1998   Hung et al. .......................... 365/185.03

OTHER PUBLICATIONS

A Million–Cycle CMOS 256K EEPROM, Dumitru Cioaca et al., IEEE Journal of Solid–State Circuits, vol. SC–22, No. 5, Oct. 5, 1987, pp. 684–692.

EEPROM Standards and Reliability: An Interim Report, Richard Orlando, EDN Electrical Design News, vol. 30, No. 1, Jan. 10, 1985, pp. 159–174.

*Primary Examiner*—David Nelms
*Assistant Examiner*—Hoai V. Ho
*Attorney, Agent, or Firm*—Wolf, Greenfield & Sacks, P.C.

[57]             ABSTRACT

A circuit for activating page-write operations in a floating-gate memory includes a first and a second time lag circuit. A resetting signal resets a first time lag whenever a word is written in a buffer of the memory. The first time lag circuit provides a state bit indicating that the first time lag has ended or not ended. The second time lag circuit activates a second time lag at the end of the first time lag and the end of the second time lag activates the writing of the page in the memory. The invention also relates to a method of writing in memory that uses a first and a second time lag.

19 Claims, 2 Drawing Sheets

PAGE-WRITE INDICATOR FOR NON-VOLATILE MEMORY

BACKGROUND OF THE INVENTION

1. Field of Invention

The invention relates to a page-write indicator for a volatile memory. This invention relates to memories that possess a page-write mode, especially E²PROM, EPROM and Flash EPROM floating-gate memories.

2. Discussion of the Related Art

Writing in a floating-gate memory is a relatively lengthy process in terms of time. To overcome this drawback, the manufacturers have created a mode of sequential writing also known as the page-write mode wherein a page of data is loaded at one time. In page-write mode, all the bytes located on one and the same line of words of the memory array are addressed successively in being stored in volatile registers. Then, when all the volatile registers have received their bytes, the contents of all the registers are written simultaneously on the word line. Since the time taken for writing in the memory is about 2 ms for an E²PROM memory and since the time taken for writing in the register is smaller than 100 ns, if 64-word lines are available in the memory array, then the memory programming time is divided by 64, which is a considerable advantage.

An improvement to this system has been made in order to enable the writing of incomplete word lines. Indeed, in certain applications the user may be satisfied with writing incomplete pages, for example to save data in the event of the malfunctioning of an electronic system. Here, the manufacturers have devised a time lag system to activate the operation of writing in the memory array. These memories then function as follows:

- at each input of a byte into a register, a time lag circuit is reset;
- when the time lag circuit has counted out a period, predefined by the manufacturer, of about 100 µs, then the writing is activated.

A major drawback arises out of the time lag circuit because the microprocessor that writes in the memory may be interrupted by a priority task whose duration may overlap the period of the time lag. A simple solution using one time lag circuit has been implemented, and this is what now constitutes the prior art.

FIG. 1 shows the circuit for activating the writing of pages in an electrically programmable non-volatile memory according to the prior art. An edge detection circuit 1 receives a word write signal WE and gives a resetting signal INIT. The time lag circuit 2 receives, firstly, the resetting signal INIT given by the detection circuit 1 and, secondly, a page-write signal /ECRP indicating that the circuit is in page-write mode. This time lag circuit 2 gives a state bit at an output, this state bit indicating whether a time lag is in progress or whether the time lag has ended. The output of the time lag circuit 2 is connected so as to serve firstly as an indicator in a state register of the memory and secondly as a page-writing activation signal.

As shown in FIG. 1, the time lag circuit is reset when the page-writing signal /ECRP is in the high state. Then, as soon as the page-writing signal /ECRP goes to the low state, the time lag circuit 2 activates its time lag. Whenever a word-writing operation is detected, the detection circuit gives a pulse on the resetting signal NIT which resets the time lag of the time lag circuit 2. When the time lag is over, the bit given at output of the time lag circuit changes its state, indicating the activation of the write command at the same time as the indicator switches over to indicate that the time lag is over.

Many other variants exist in the prior art. Among others, the page-write signal /ECRP may be eliminated; in this case, it acts indirectly for example on the word-write signal WE and/or on the page-write command by means of a logic gate.

According to the prior art, the time lag circuit is reset whenever a byte is written in the memory whose output can be accessed by the microprocessor. Thus, after each interruption of the writing operation, the microprocessor can read a state register where a bit gives it the state of the time lag. This results in the following problem: it is possible, although the probability is low, that a bit which is being tested indicates that the time lag has not ended but that there is not enough time available for writing in memory.

One solution is to solve this problem by software means. The microprocessor tests the state bit a first time, then writes in the memory, and then tests the state bit again. If the second test of the state bit indicates that the time lag has not ended, then it may continue the programming. Otherwise, it must await the end of the operation for writing in memory, and then reactivate a page-write operation. However, the performance of two tests is an operation that is rather cumbersome to manage. Moreover, certain real-time systems set the use of a minimum number of instructions.

SUMMARY OF THE INVENTION

An embodiment of the present invention proposes a more reliable approach that does not require any software masking. An embodiment of the present invention resolves the problem of the prior art by the addition of an additional time lag serving as a safety time reserve for the first time lag.

An object of the invention is a circuit to activate a page-write operation in a floating-gate memory. The circuit includes a first time lag circuit having a resetting input which receives a signal for the resetting of a first time lag whenever a word is written in a buffer register of the memory and which, at an output, provides a state bit. The state bit indicates when it is in a first state, that the first time lag has not ended. The circuit also includes a second time lag circuit having an input connected to the output of the first time lag circuit and an output connected to a memory-write device. The second time lag circuit is activated at the end of the first time lag, and the output of the second time lag circuit is used to activate the writing of the page in the memory at the end of a second time lag.

In one embodiment of the present invention, the circuit includes means to reset the first and second time lags so long as the second time lag has not ended. The first and second time lag circuits also may include one counter each or a common counter.

An object of the invention is also a method for performing page-write operations in a floating-gate memory in which a first time lag is reset whenever a word is written in a buffer register of the memory and a state bit is provided at an output. When it is in a first state, the state bit indicates, that the first time lag has not ended. A second time lag is activated at the end of the first time lag, and the end of the second time lag activates the writing of the page in the memory. Preferably, the first and second time lags are capable of being reset so long as the period of the first time lag has not elapsed.

The resetting of the first time lag may occur during a change of state of a word-write signal that corresponds to the point in time when the word is loaded into a buffer of the memory and/or during a change in state of the word-write signal that corresponds to the beginning of a word-write sequence. The second time lag ensures that the user will remain within a minimum predefined period of time for writing in the memory starting from the time when the state bit is in the first state.

BRIEF DESCRIPTION OF THE DRAWINGS

The invention will be understood more clearly and other advantages will appear from the following description and from the appended drawings, of which.

DETAILED DESCRIPTION

The present invention will be more completely understood through the following detailed description which should be read in conjunction with the attached drawing in which similar reference numbers indicate similar structures.

Figure 1:
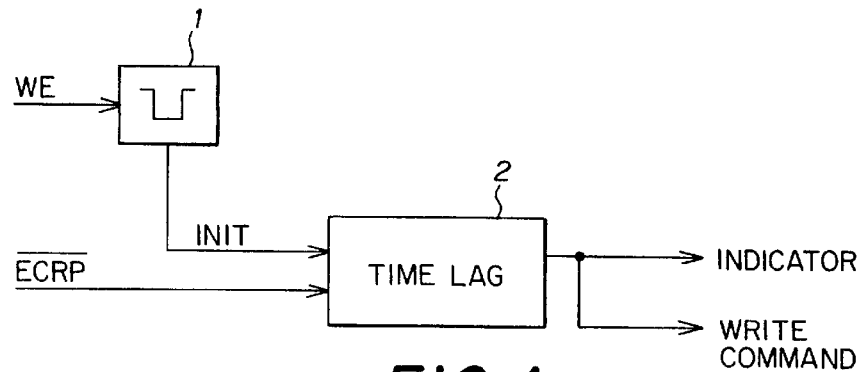
FIG. 1 illustrates an example of the state of the prior art.
Figure 2:
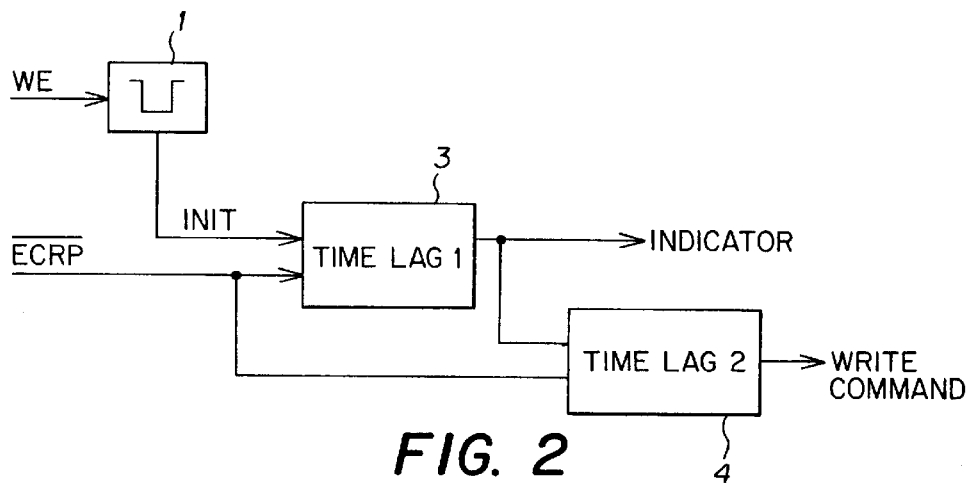
FIG. 2 shows a schematic view of the invention.

In FIG. 2, the page-write activation circuit includes a detection circuit 1 similar to that of FIG. 1 and further includes first and second time lag circuits 3 and 4. The first time lag circuit 3 is similar to the time lag circuit 2 of FIG. 1. This first time lag circuit 3 receives the resetting signal INIT and the page-write signal /ECRP in order to give, at an output, an indicator bit which, depending on its state, indicates whether a first time lag generated by the first time lag circuit is in progress or whether the first time lag is over. The second time lag circuit 4 receives, at a first input, the page-write signal /ECRP. A second input of the second time lag circuit 4 is connected to the output of the first time lag circuit. The output of this second time lag circuit 4 gives the page-write command.

In one embodiment of the present invention, it is possible to eliminate the page-write signal /ECRP in FIG. 2, under the same conditions as in FIG. 1. A possible operation of the circuit of FIG. 2 will be understood more clearly from the timing diagram of FIG. 3. The page-write signal /ECRP is not shown in FIG. 3.

The first timing diagram 5 shows the word-write signal WE. In the present example, the word to be loaded into the memory must be shown on a data bus of the memory when the word-write signal is in the low state. Then, during a leading edge 6 of the word-write signal WE, the word is loaded into a register of the memory pending its being loaded into the matrix of the memory.

The second timing diagram 7 shows the resetting signal given by the detection circuit 1. In the present example, only the leading edges 6 of the word-write signal WE are detected. During each of the leading edges 6 of the word-write signal WE, the detection circuit produces pulses on the resetting signal INIT. The pulses may be very brief, in the range of some ns.

The third timing diagram 8 shows the output of the time lag circuit 3 which corresponds also to the indicator bit informing the user that the first time lag is in progress or has ended. On this third timing diagram 8, the time lag in progress is represented by a low state and the time lag that has ended is represented by a high state. Furthermore, the time lag is in progress from the very beginning of the timing diagram; in fact, the time lag may begin at the reception of a first pulse of the resetting signal INIT as soon as there is an active page-write signal /ECRP. The indicator bit remains in the low state so long as the first time lag T1 has not elapsed, the first time lag T1 being reset by each of the pulses of the resetting signal INIT.

The fourth timing diagram 9 represents the page-write control signal, given by the second time lag circuit 4 which activates the writing of the buffer registers in a page of the memory matrix, on the basis of a leading edge 10 of this control signal. The control signal may be reset for example by the page-write signal /ECRP or by the pulses of the resetting signal INIT. However, the second time lag T2 of the second time lag circuit 4 is activated only when the output of the first time lag circuit 3 indicates the end of the first time lag T1.

Figure 3:
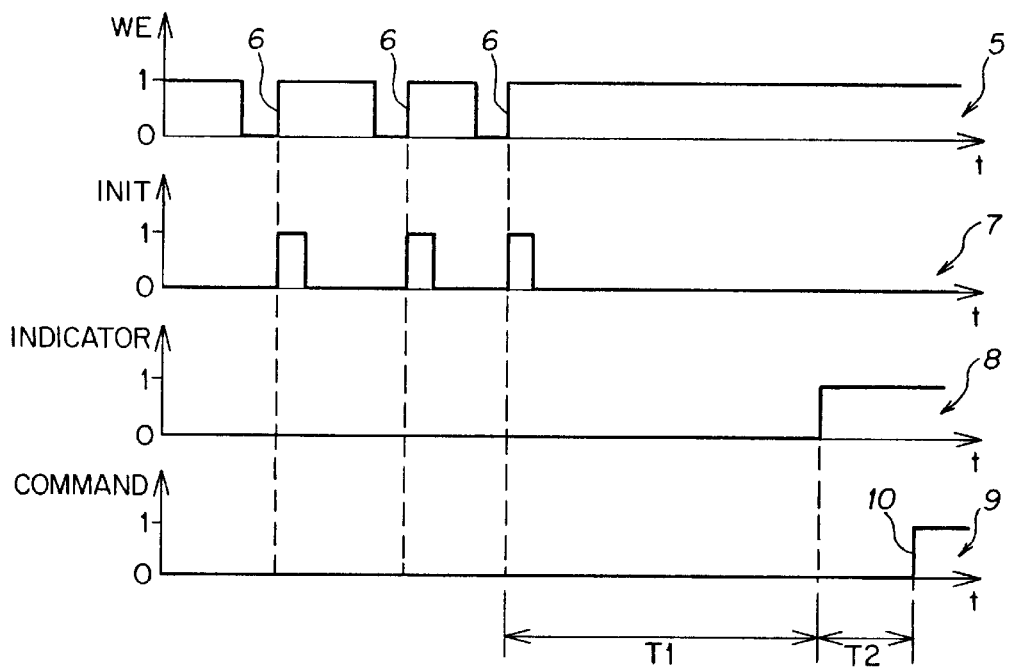
FIG. 3 shows timing diagrams of the operation of the invention.

With a device working as indicated in the timing diagrams of FIG. 3, there is available an indicator which indicates that it is still possible to write words in the memory with a time reserve that enables writing for a certain period of time after the indicator bit has changed its state.

For example, the first time lag is 100 µs and the second time lag is 10 µs. Thus, the user of a memory of this kind knows that there is a period of 100 µs available to temporarily interrupt the writing of the page. Furthermore, should there be an unexpected interruption, the testing of the indicator bit indicates, if the first time lag has not ended, that there are at least 10 µs left to carry out the writing of a word (which is amply sufficient).

Of course, those skilled in the art will understand that the low and high states may be reversed, and also the leading and trailing edges. It is also possible to modify the time of resetting the time lag circuit as well as the numerical values of the time lag circuits without departing from the purview of the invention.

Figure 4:
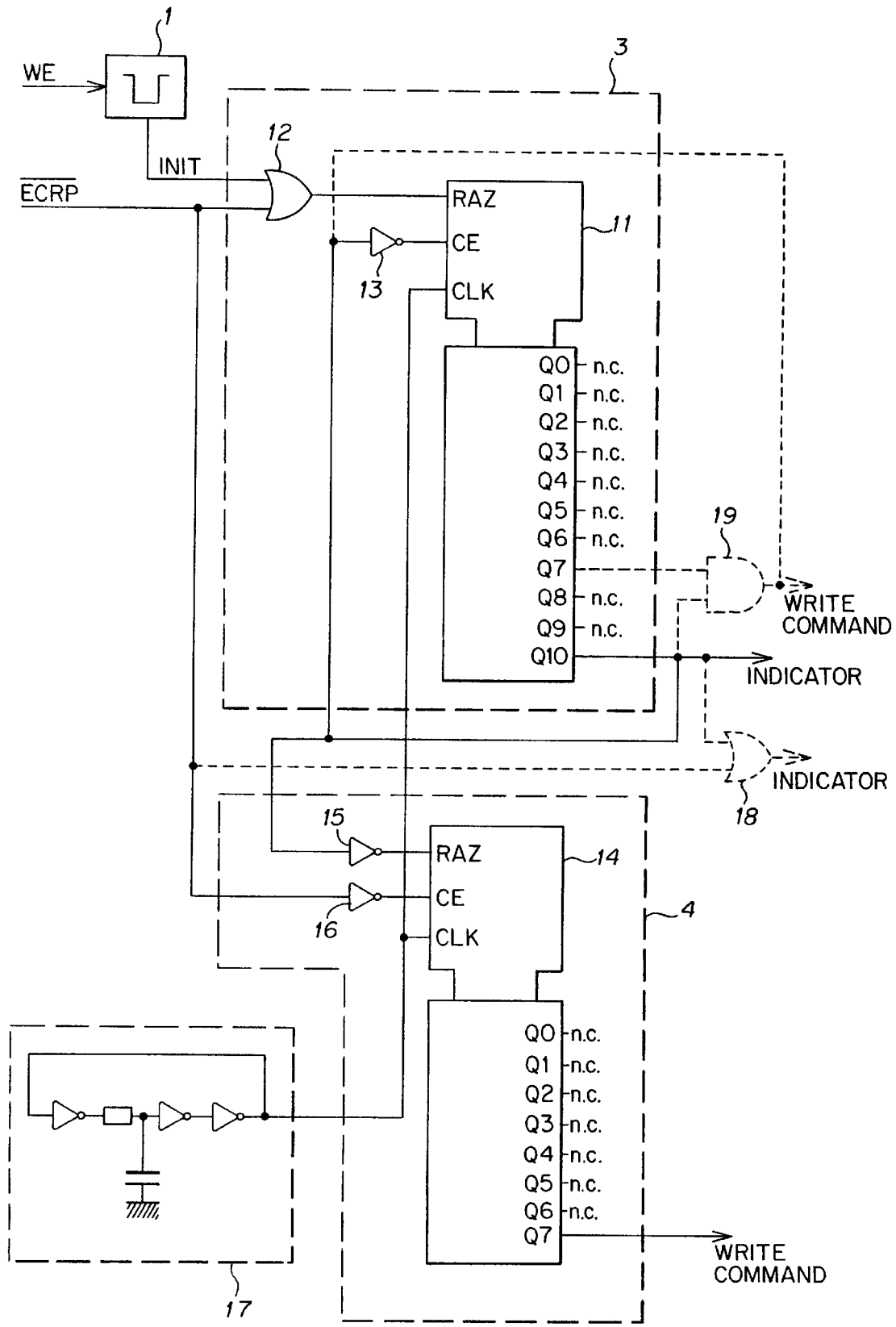
FIG. 4 shows two alternative embodiments of the invention in one and the same drawing.

FIG. 4 shows a detailed embodiment of the circuit of FIG. 2 working as indicated in the timing diagrams of FIG. 3.

The first time lag circuit 3 has a counter 11 counting in binary mode on eleven bits and having a resetting input RAZ, a count-enable input CE, a clock input CLK and eleven counting outputs Q0 to Q10. An OR gate 12 with two inputs and one output has its output connected to the resetting input RAZ of the counter 11, one of its inputs receiving the resetting signal INIT and the other of its inputs receiving the page-write signal /ECRP. An inverter 13 having one input and one output has its output connected to the count-enable input CE of the counter 11 and its input connected to the output Q10 of the counter 11. The output Q10 gives the counting state indicator bit.

The second time lag circuit 4 has a counter 14, counting in binary mode on eight bits and having a resetting input RAZ, a count-enable input CE, a clock input CLK and eight counting outputs Q0 to Q7. The resetting input RAZ of the counter 14 is connected to the output Q10 of the counter 11 by means of an inverter 15. The count-enable input of the counter 14 receives the page-write signal /ECRP by means of an inverter 16.

A clock generator circuit 17, for example a ring oscillator, provides a clock signal at an output. The output of the clock generator circuit 17 is connected to the clock inputs CLK of the two counters 11 and 14 in order to set the rate of the counters 11 and 14.

In the circuit of FIG. 3, when the page-write signal /ECRP is inactive, namely in the high state, the counter 11 is reset, the counter 14 being also reset by the inverter 15. When the page-write signal is active, namely in the low state, the counter 11 is no longer reset. However, so long as the bit Q10 of the counter 11 is at zero, the counter 14 is reset. Whenever a leading edge is detected on the word-write signal WE, the counter 11 is reset. When the counter 11 has counted 1024 clock cycles, the output Q10 goes to "one", stopping the count operation by the counter 11 and permitting the count operation by the counter 14. When the counter 14 has counted 128 clock cycles, the write command changes its state, thus activating the writing of the page in the memory matrix. If a leading edge of the word-write signal WE is detected before the output Q7 of the counter 14 has changed its state, then the counter 11 is reset, and so is the counter 14. When the writing in the memory is activated, the word-write signal WE is neutralized in order to prevent any disturbance during the write operation, thus prohibiting the resetting of the counter.

It is also possible to use an OR gate 18 with two inputs and one output, one of the inputs receiving the signal /ECRP and the other input being connected to the output Q10, the output of the gate giving the indicator bit, in order to obtain a more stable indicator bit. In this case, the signal /ECRP will be deactivated as soon as the writing in the memory matrix has begun.

Another improvement consists in using only one counter 11. For this purpose, an AND gate 19 with two inputs and one output is added. The inputs of the AND gate are respectively connected to the outputs Q10 and Q7 of the counter 11 in order to give a write command at the output. For this purpose, the input of the inverter 13 must be connected to the output of the AND gate 19 so that the counter counts up to 1024+128 clock cycles. With a modification of this kind, the first and second time lag circuits can no longer be dissociated from each other.

Those skilled in the art can also modify the system by using for example a single counter using two decoders to detect two precise counting values, each of the decoders activating or deactivating a flip-flop circuit. Many possibilities can be envisaged. The sizes of counters may be modified. It is also possible to detect the leading edges and trailing edges of the word-write signal WE so as to make it possible to increase the duration of the first time lag slightly as a function of the write time needed for the elements external to the memory. Various types of edge detectors or oscillators may be used.

The detailed example of FIG. 4 is given purely by way of example. Thus, it is possible to use time lag elements other than counters such as, for example, reactive monostable circuits.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A circuit to activate page-write operations in a floating-gate memory comprising:
   a first time lag circuit having an initializing input which receives a signal for the resetting of a first time lag whenever a word is written in a buffer register of the memory and which, at an output, provides a state bit, the state bit indicating, when it is in a first state, that the first time lag has not ended;
   a second time lag circuit having an input connected to the output of the first time lag circuit and an output connected to a memory-write device, the second time lag circuit being activated at the end of the first time lag, and the output of the second time lag circuit being used to activate the writing of the page in the memory at the end of a second time lag.

2. The circuit according to claim 1, wherein the first time lag circuit includes a counter.

3. The circuit according to claim 2, wherein an output of the counter of the first time lag circuit is connected to an input of a counter in the second time lag circuit.

4. The circuit according to claim 2, wherein the second time lag circuit receives a page-write signal.

5. The circuit as claimed in claim 1, wherein the second time lag indicates a minimum predefined period of time for writing in the memory, starting from the time the state bit is in the first state.

6. A circuit according to claim 1, wherein the second time lag circuit includes a counter.

7. A circuit according to claim 1, wherein the first and second time lag circuits include a common counter.

8. A circuit according to claim 1, further comprising means to reset the first and second time lags so long as the second time lag has not ended.

9. A method for performing page-write operations in a floating-gate memory in which a first time lag is reset whenever a word is written in a buffer register of the memory and a state bit is provided at an output, the state bit indicating, when it is in a first state, that the first time lag has not ended, comprising the steps of:
   activating a second time lag at the end of the first time lag; and
   activating writing of a page in the memory at the end of the second time lag.

10. The method according to claim 9, wherein the first and second time lags are capable of being reset so long as the first time lag has not lapsed.

11. The method according to claim 9, wherein the resetting of the first time lag occurs during a change in state of a word-write signal that corresponds to a point in time when the word is loaded into a buffer of the memory.

12. The method according to claim 9, wherein the resetting of the first time lag occurs during a change in state of a word-write signal that corresponds to a beginning of a word-write sequence.

13. A circuit for activating a page-write operation in a floating gate memory comprising:
   a first time lag circuit; and
   a means for generating a second time lag activated at an end of a first time lag by the first time lag circuit, an output of the means activating the page-write operation at an end of the second time lag.

14. The circuit as claimed in claim 13, wherein the means for generating includes a counter.

15. The circuit as claimed in claim 13, further comprising means to reset the first and second time lags so long as the second time lag has not ended.

16. The circuit as claimed in claim 14, wherein the counter is connected to the first time lag circuit through an inverter.

17. The circuit as claimed in claim 14, wherein the counter is not reset during the page-write operation.

18. The circuit as claimed in claim 13, wherein the first time lag circuit provides a state bit, the state bit indicating when it is in a first state, that the first time lag has not ended.

19. The circuit as claimed in claim 18, wherein the second time lag indicates a minimum predefined period of time for writing in the memory, starting from the time the state bit is in the first state.

* * * * *